United States Patent [19]
Daniele

[11] Patent Number: 6,005,411
[45] Date of Patent: Dec. 21, 1999

[54] MONOLITHICALLY INTEGRATED PROGRAMMABLE DEVICE HAVING ELEMENTARY MODULES CONNECTED ELECTRICALLY BY MEANS OF MEMORY CELLS OF THE FLASH TYPE

[75] Inventor: Vincenzo Daniele, Milan, Italy

[73] Assignee: SGS-Thomson Microelectronics S.r.l., Agrate Brianza, Italy

[21] Appl. No.: 08/777,296

[22] Filed: Dec. 27, 1996

[30] Foreign Application Priority Data

Dec. 29, 1995 [EP] European Pat. Off. ............. 95830552

[51] Int. Cl.⁶ ................... H03K 19/094; H03K 19/177; H03K 19/173
[52] U.S. Cl. ................ 326/44; 326/40; 326/41; 326/38
[58] Field of Search ................. 326/44, 49, 38, 326/39, 40, 41

[56] References Cited

U.S. PATENT DOCUMENTS

| | | | |
|---|---|---|---|
| 4,282,446 | 8/1981 | McElroy | 326/44 |
| 4,642,487 | 2/1987 | Carter | 326/41 |
| 4,807,188 | 2/1989 | Casagrande | 365/182 |
| 5,028,821 | 7/1991 | Kaplinsky. | |
| 5,103,425 | 4/1992 | Kuo et al. | 365/226 |
| 5,247,478 | 9/1993 | Gupta et al. | 365/185 |
| 5,324,998 | 6/1994 | Powell. | |
| 5,336,936 | 8/1994 | Allen et al. | 326/44 |
| 5,392,253 | 2/1995 | Atsumi et al. | 365/230.06 |
| 5,396,115 | 3/1995 | Coffman et al. | 327/143 |
| 5,399,928 | 3/1995 | Lin et al. | 326/92 |
| 5,450,417 | 9/1995 | Truong et al. | 327/198 |
| 5,463,579 | 10/1995 | Shimoji | 365/185.01 |
| 5,600,264 | 2/1997 | Duong et al. | 326/39 |

FOREIGN PATENT DOCUMENTS

| | | |
|---|---|---|
| 0 523 817 | 1/1993 | European Pat. Off. . |
| 0 581 461 | 2/1994 | European Pat. Off. . |
| 3 139 863 | 6/1991 | Japan . |

*Primary Examiner*—Michael Tokar
*Assistant Examiner*—Daniel D. Chang
*Attorney, Agent, or Firm*—Jenkens & Gilchrist, P.C.

[57] ABSTRACT

The present invention is a monolithically integrated programmable device having elementary modules connected electrically by means of memory cells of the flash type, which cells allow the signal paths between signal lines of the elementary modules to be programmed and re-programmed. Preferably, the flash memory cells are Fowler-Nordheim Effect cells.

5 Claims, 3 Drawing Sheets

MONOLITHICALLY INTEGRATED PROGRAMMABLE DEVICE HAVING ELEMENTARY MODULES CONNECTED ELECTRICALLY BY MEANS OF MEMORY CELLS OF THE FLASH TYPE

TECHNICAL FIELD OF THE INVENTION

This invention relates to monolithically integrated programmable devices, in particular to such devices as are known by the acronym FPGA (Field Programmable Gate Array).

BACKGROUND OF THE INVENTION

In recent years, the demand for FPGAs has kept growing at a rate that can be termed exponential. Two techniques are currently employed to make FPGAs. A first technique uses structures of the PLA (Programmable Logic Array) type, whereby extensive combinatorial logics can be implemented, but which are disadvantageous in applications of intensive sequential logics due to the limited number of flip-flops allowed. The second technique uses elementary modules, each capable of implementing combinatorial and sequential logics. Such modules are connected together as appropriate to produce the circuitry of interest using a technique much in the same class as gate array designing—whereby the elementary cells typically are connected by a second metallization level during the fabrication process—except that in FPGAs the elementary modules provided are either connected together or isolated from the circuitry or re-configured electrically, rather than during the process.

Currently utilized for the purpose are either switches driven by static RAMs—which have the disadvantage of losing their configurations on the occurrence of a power supply failure—or so-called "anti-fuses", which can only be programmed once and pose all the problems that are typical of fuses, including testing.

As is well known, anti-fuses generally are thin dielectrics adapted to be perforated by a high voltage.

It should be further considered that the application of anti-fuses involves additional, non-standard process steps.

Examples of such techniques are represented by products sold by two manufacturers of FPGAs: XILINX STYLE and ACTEL.

The underlying technical problem of this invention is to provide FPGAs with electrical interconnections between elementary modules which afford improved programmability and reliability over prior solutions.

This technical problem is solved by FPGAs having a structure as previously outlined and defined in the characterizing portions of the appended claims to this specification.

SUMMARY OF THE INVENTION

The present invention is a monolithically integrated programmable device having elementary modules connected electrically by means of memory cells of the flash type, which cells allow the signal paths between signal lines of the elementary modules to be programmed and re-programmed.

Preferably, the flash memory cells are Fowler-Nordheim Effect cells.

The features and advantages of an FPGA structure according to the invention will become apparent upon reading the following description of an embodiment thereof, as given by way of example and not of limitation, with reference to the accompanying drawings.

DETAILED DESCRIPTION OF A PREFERRED EMBODIMENT

The present invention solves the problem by using, as the interconnect elements, memory cells of the flash type, thereby to afford re-programmability, improved reliability, and applicability of a technology which is becoming ever more popular in the field of semiconductors and allows increasingly smaller electric interconnect cells to be obtained.

Memory cells of the flash type, as used in this invention, are those providing a double Fowler-Nordheim Effect in conformity with the most up-to-date technology yielding large-scale cells of the flash type. The cell is written by applying a positive voltage to its upper control electrode and leaving its drain and/or source to float. Under this condition, an electric field is created which draws electrons onto the floating gate of the cell and elevates the cell threshold within a time period that is dependent on the value of the gate voltage and typically on the order of a few milliseconds.

The cell is erased by applying a negative voltage to its upper control gate and a positive voltage (5 volts), corresponding to a voltage logic level of 1 as defined on the logic circuits included in the elementary modules, to the cell drain and/or source.

The voltage value should be selected to be, on the cell having a floating or zero-volt source and/or drain, sufficient to draw the electrons present on the floating gate. Based on Fowler-Nordheim's Effect, where the gate oxide is very thin, the electron stream will run in either direction by "tunneling".

Figure 1:
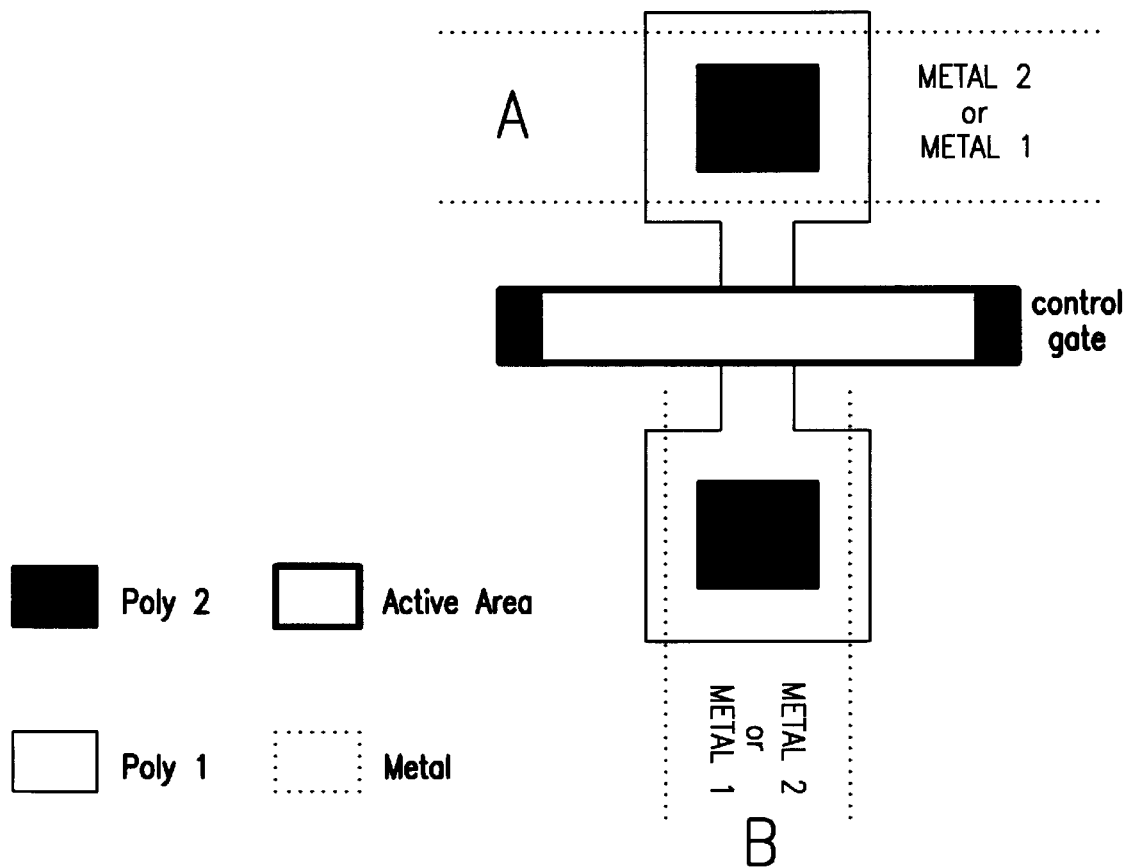
FIG. 1 shows an interconnect cell of the flash type for electrically connecting, in accordance with the invention, two single signal lines of two generic elementary FPGA modules.

Consider the instance of a single flash interconnect cell as shown in FIG. 1, and assume that a line A and a line B of two discrete elementary modules are to be connected.

The control gate is applied a negative voltage (approximately −8 volts), and the line B is allowed to float or is grounded. Upon a positive signal at 5 volts being applied to the line A, the electric field will draw electrons from the floating gate, bringing the cell transistor to a depleted state: the line A is electrically connected to the line B. This would not occur if the line A were left grounded. In order to break the connection, it is sufficient to apply a positive voltage (approximately +15 volts) to the control gate and leave one of the two terminals to float.

The flash cell depicted in FIG. 1 as an electrical interconnect element is of a standard type conventionally formed of material layers as shown in the figure.

Figure 2:
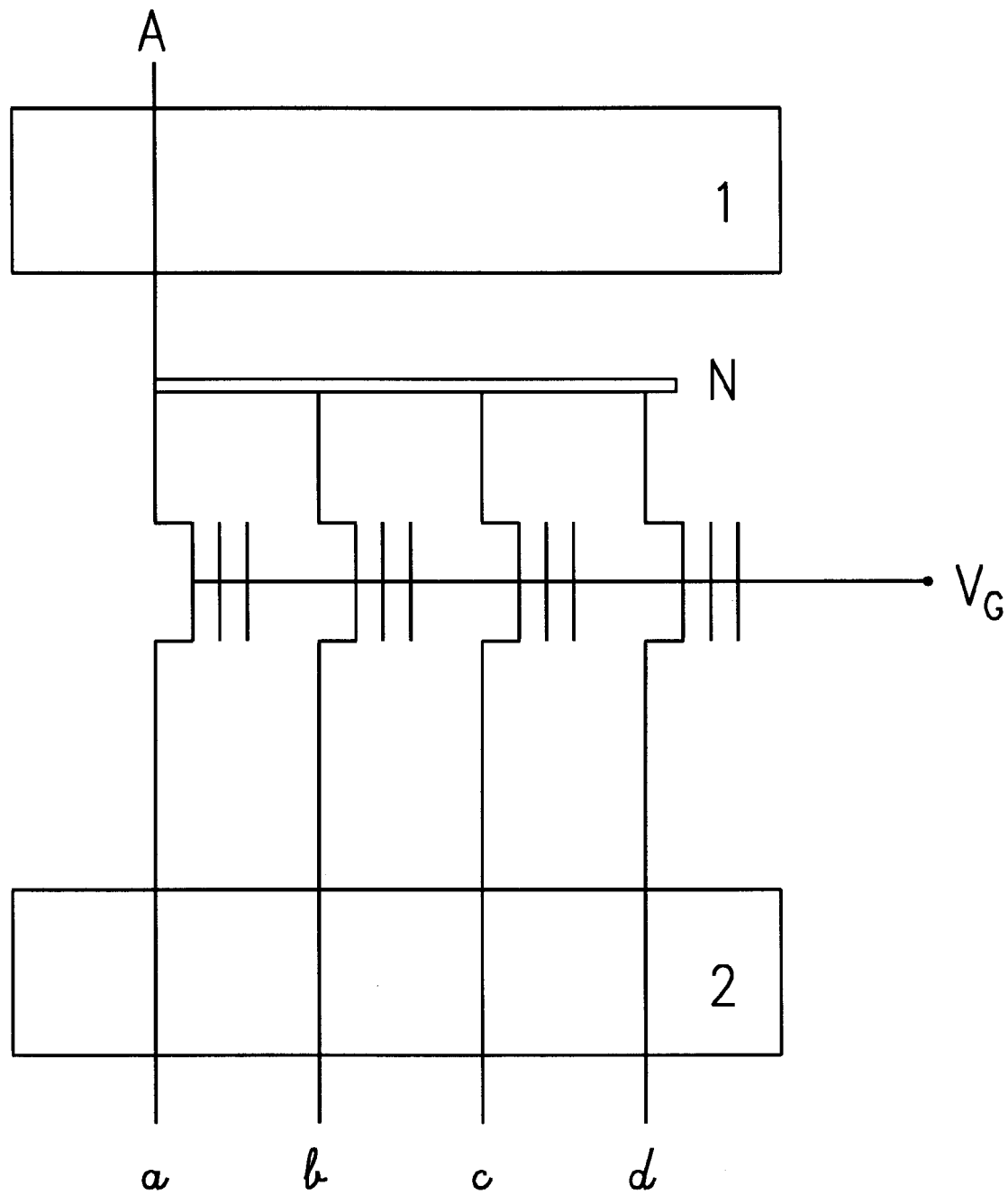
FIG. 2 shows two generic elementary FPGA modules, each represented by some symbolic lines, and shows electrical interconnections for connecting, in accordance with the invention, one line of one module to several lines of the other module.

FIG. 2 shows how, according to the invention, flash cells function as interconnect elements between a signal transmission line A of a first elementary module and a plurality of lines a, b, c, d of another elementary module (simple multiple interconnection).

Flash cells having first and second terminals and a control terminal are placed between the single line A and a plurality of lines a, b, c, d, respectively through the first terminal, implemented as a region having a common diffusion of N impurities, and the second terminals.

The gate control terminals of the cells are connected to a common voltage generator $V_G$.

The programming or connecting operation is carried out as follows: the common gate terminal is applied a negative voltage (approximately −8 volts), the line A is brought either to a float or a ground potential, and a positive voltage (5 volts) is applied to those lines which are to be connected, so as to bring the flash transistor affected by the connection to a heavily depleted state.

No connection is established for the line(s) (a, b, c, d) which are applied no positive voltage.

On the other hand, the erase or disconnect operation is carried out by applying a positive voltage (approximately +15 volts) to the common gate terminal and bringing the line A to a float potential.

Figure 3:
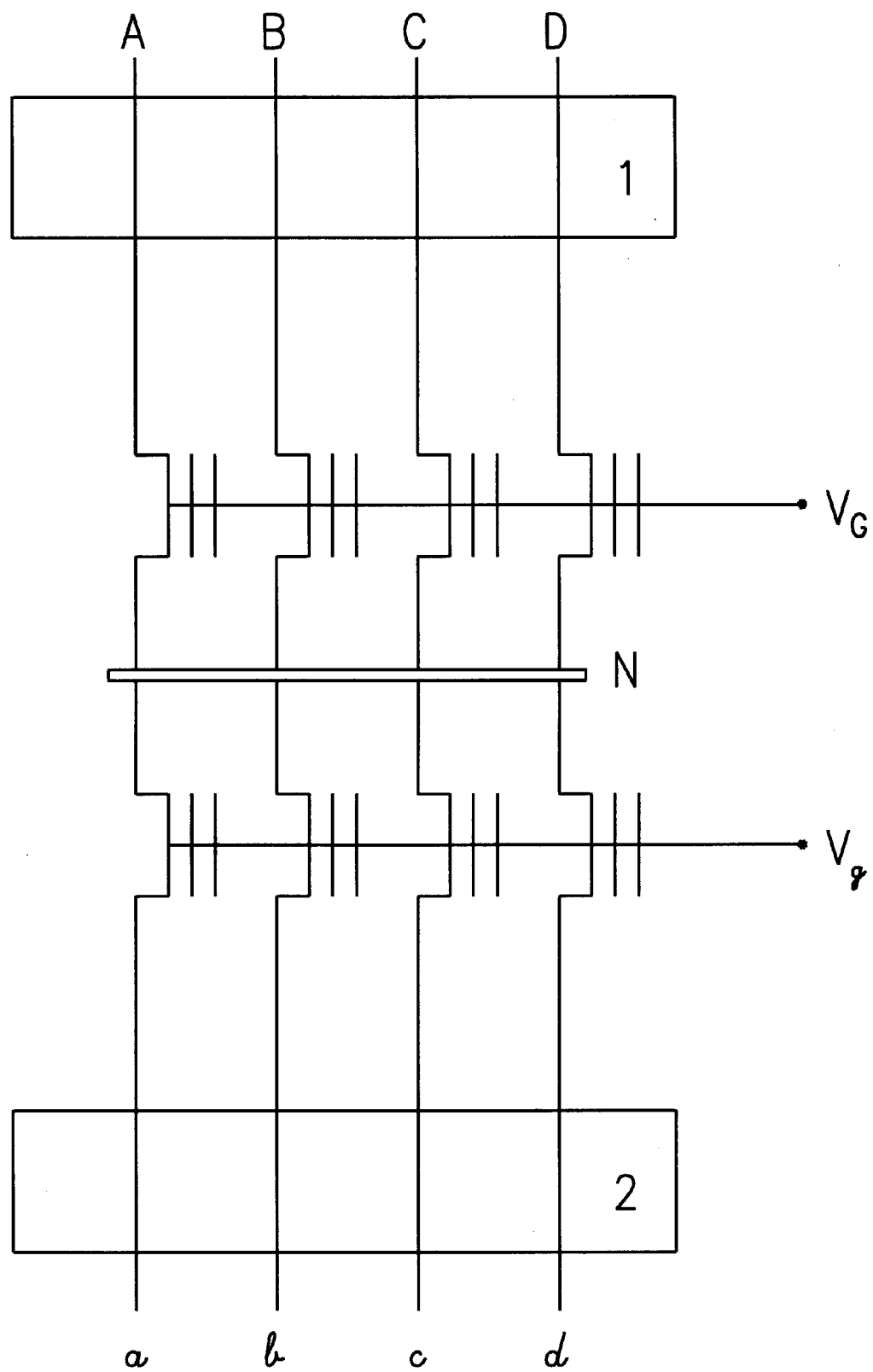
FIG. 3 shows how a plurality of lines of the first elementary module can be connected electrically to a plurality of lines of the second module.

FIG. 3 shows how, according to the invention, flash cells function as interconnect elements between a plurality of signal transmission lines A, B, C, D of a first elementary module and a corresponding plurality a, b, c, d of lines of another elementary module (complex multiple interconnection).

A first plurality and corresponding second plurality of flash cells, each having first and second terminals and a control terminal, are placed between the corresponding lines of the two modules.

Between each line of the first module and a corresponding line of the second module, a flash cell in the first plurality and a cell in the second plurality are placed in series with each other through their respective first and second terminals, with the connection node (as implemented by a common diffused region) in common with those of the other cell pairs.

The gate control terminals of the cells in each plurality are connected to a respective common voltage generator, $V_G$ and Vg.

The erasing is performed by applying a positive voltage (approximately +15 volts) to the common gates, and leaving the line(s) to be connected in a floating state.

The writing is performed by applying a negative voltage (−8 volts) to the common gates and a positive voltage (+5 volts) to the lines to be connected. The other lines are either left in a floating or a grounded state.

No connections are established for the lines which are left grounded or in a floating state.

The erase operation must always precede the write operation.

It should be understood that the embodiments described hereinabove for illustration purposes may be the subject of many modifications, integrations and substitutions of their elements without departing from the scope of the appended claims.

For example, it is no strict condition that the flash memory cells be of the Fowler-Nordheim Effect type.

What is claimed is:

1. A monolithically integrated programmable device comprising at least first and second elementary modules, each having a plurality of signal-carrying lines, wherein the programmable device further comprises at least first and second pluralities of memory cells of the flash type, each having first and second terminals and a control terminal, between individual lines in said plurality of signal-carrying lines of the first elementary module and individual lines in said plurality of signal-carrying lines of the second elementary module there being connected electrically, in series with each other through their respective first and second terminals, a memory cell of the first plurality of memory cells of the flash type and a memory cell of the second plurality of memory cells of the flash type, respectively, the connection node between the two memory cells being a connection node shared in common by all the pairs of interconnected memory cells, the control terminals of the memory cells in the first plurality of memory cells being connected to a first control signal generator, and the control terminals of the memory cells in the second plurality of memory cells being connected to a second control signal generator.

2. A programmable device according to claim 1 wherein the memory cells of the flash type are Fowler-Nordheim Effect cells.

3. A programmable device according to claim 1, wherein the connection node shared by the pairs of interconnected memory cells is a common region of the monolithically integrated memory cells where impurities an N type have been diffused.

4. A programmable integrated circuit, comprising:
   a first elementary logic circuit module having at least one first wire segment, said first elementary logic circuit module includes a plurality of first wire segments;
   a second elementary logic circuit module having at least one second wire segment; and
   at least one transmission gate element having a first electrode connected to said first wire segment and a second electrode connected to said second wire segment, said transmission gate element being selectively programmably turned on;
   said programmable integrated circuit includes a plurality of said transmission gate elements and said first elementary logic circuit includes a plurality of first wire segments, each transmission gate element having a first electrode connected to a distinct first wire segment, a second electrode connected to said second wire segment and a control electrode;
   control electrodes of said transmission gate elements are connected together.

5. The programmable integrated circuit of claim 4, wherein:
   said transmission gate element is selectively programmably turned off.

* * * * *